(12) United States Patent
Kuchimachi

(10) Patent No.: US 7,312,974 B2
(45) Date of Patent: Dec. 25, 2007

(54) ELECTROSTATIC CHUCK

(75) Inventor: Kazuhiro Kuchimachi, Kokubu (JP)

(73) Assignee: Kyocera Corporation, Kyoto (JP)

( * ) Notice: Subject to any disclaimer, the term of this patent is extended or adjusted under 35 U.S.C. 154(b) by 228 days.

(21) Appl. No.: 10/853,773

(22) Filed: May 25, 2004

(65) Prior Publication Data
US 2005/0024809 A1    Feb. 3, 2005

(30) Foreign Application Priority Data
May 26, 2003    (JP)    ............ P 2003-147454

(51) Int. Cl.
*H01L 21/683*    (2006.01)
(52) U.S. Cl. .................................... 361/234
(58) Field of Classification Search ............... 361/234
See application file for complete search history.

(56) References Cited

U.S. PATENT DOCUMENTS

| | | | | |
|---|---|---|---|---|
| 4,786,467 A | * | 11/1988 | Skibo et al. | 420/129 |
| 5,447,908 A | * | 9/1995 | Itozaki et al. | 505/239 |
| 5,478,456 A | * | 12/1995 | Humpal et al. | 204/192.13 |
| 6,133,557 A | * | 10/2000 | Kawanabe et al. | 219/544 |
| 6,197,151 B1 | * | 3/2001 | Kaji et al. | 156/345.46 |
| 6,277,506 B1 | * | 8/2001 | Okamoto | 428/701 |

FOREIGN PATENT DOCUMENTS

| | | |
|---|---|---|
| JP | 58-123381 | 7/1983 |
| JP | 59-092782 | 5/1984 |
| JP | 04-049879 | 2/1992 |
| JP | 04-287344 | 10/1992 |
| JP | 08-288379 | 11/1996 |
| JP | 08288376 A * | 11/1996 |
| JP | 11-265930 | 9/1999 |

* cited by examiner

*Primary Examiner*—Michael Sherry
*Assistant Examiner*—Scott Bauer
(74) *Attorney, Agent, or Firm*—Hogan & Harston LLP

(57) ABSTRACT

The electrostatic chuck includes: a conductive base formed of metal or both metal and ceramics, serving as a chucking electrode; and an insulating film formed on one principal plane of the conductive base, the top face of the insulating film serving as a placing surface for placing a wafer; wherein the insulating film is formed of a uniform amorphous ceramics of an oxide and has a thickness in a range of 10 to 100 μm, thereby preventing cracking and insulation breakdown in the insulating film and improving characteristics of releasing the wafer.

2 Claims, 2 Drawing Sheets

Prior Art

Prior Art

ELECTROSTATIC CHUCK

BACKGROUND OF THE INVENTION

1. Field of the Invention

The present invention relates to an electrostatic chuck, specifically, for holding a semiconductor wafer (hereinafter, called wafer) or a liquid crystal glass in an etching step for minutely processing, a depositing step for forming a thin film, or a exposing step for exposing a photoresist film, on the wafer or the liquid crystal glass in a semiconductor or liquid crystal manufacturing process.

2. Description of the Related Art

Conventionally, an electrostatic chuck is used for holding a wafer using electrostatic force in an etching step for minutely processing, a depositing step for forming a thin film, or a exposing step for exposing a photoresist film, on the wafer in a semiconductor manufacturing process.

This electrostatic chuck, as shown in FIG. 5, includes a pair of chucking electrodes 53 on the top face of a ceramic base 54, and power supply terminals 58, where an insulating film 52 is formed over the chucking electrodes 53. The top surface of the insulating film 52 serves as a placing surface 52a for placing a wafer.

The electrostatic chuck 51 is an object holding apparatus utilizing the Coulomb force of static electricity. When the insulating film 52 with a dielectric constant $\epsilon$ and a thickness r is formed and the wafer is placed on the placing surface 52a and then voltage V is applied between the chucking electrodes 53, half V/2 of the voltage is applied between the wafer W and each of the chucking electrodes 53. The half voltage causes the electrostatic force for pulling the wafer W. The chucking force F per unit area of this chucking force is calculated by the following formula:

$$F=(\epsilon/2)*(V^2/4r^2)$$

The chucking force F that is an electrostatic force for holding an object increases as the thickness r of the insulating film 52 becomes smaller and the voltage V becomes higher. The higher the voltage V becomes, the more the chucking force F increases. But if it is too much, insulation of the insulating film 52 might be broke down. In addition, in case a void, such as pinhole, exists in the insulating film 52, the insulation might be broke down. Therefore, the surface of the insulating film 52 for holding an object requires smoothness and lack of pinhole.

By the way, a typical electrostatic chuck, as disclosed in the document 1 (JP-A-59-92782 (1984)), includes a metal, such as aluminum, for the electrode and a glass or organic film, such as bakelite, acrylic or epoxy, for the insulating film covering the electrode. However, these insulating film have problems in view of heat resisting properties, wear resistance, chemical resistance, etc., as well as cleanliness because abrasive powder which is generated in operation is likely to stick to a semiconductor wafer with bad influence.

Additionally, another electrostatic chuck, as shown in FIG. 3, which includes a ceramic film formed by spray coating for the insulating film 25 is disclosed in the document 2 (JP-A-58-123381 (1983)). This insulating film has a number of pinholes with a problem of withstand voltage.

Moreover, the document 3 (JP-A-4-49879 (1992)) discloses a method for forming chucking electrodes on the principal plane of a ceramic base, and then forming an insulating film with a thickness of several micrometers over the principal plane of the ceramic base using sputtering, ion plating or vacuum deposition.

For the requirement of an electrostatic chuck used in a etching process, it can be used in a range of −20 to 200 degree-C because the process temperature is changed depending on plasma-resistance in halogen corrosive gas, such as process gas or cleaning gas, and the species of film to be etched.

Processes requiring the plasma-resistance are increasingly demanded, since minute processing is increasingly developed for expansion of memory capacity of VLSI. Especially, halogen corrosive gas, such as chlorine gas, fluorine gas, is frequently used for etching gas or cleaning gas. In a cleaning step, wafer-less cleaning method in which cleaning is performed with no dummy wafer on a wafer placing face is studied. The method might strongly require the plasma-resistance of the wafer placing face.

The electrostatic chuck might require a wide range of operation temperature and durability, depending on the species of films on a wafer to be etched. Disclosed are an electrostatic chuck which includes a conductive base of aluminum alloy and a spray coating film of alumina on the surface, and another electrostatic chuck which includes a conductive base of aluminum alloy and an anodized film of aluminum for an insulating film, to complete the plasma-resistance. But these have a problem of cracking due to the difference of the thermal expansion between the aluminum base and the insulating film when temperature is rising. For the countermeasure, the document 4 (JP-A-11-265930 (1999)) discloses an electrostatic chuck which includes a spray coating film 25 of alumina for the insulating film in consideration of a coefficient of thermal expansion of the conductive base 23 made of ceramics and metal, to prevent cracking even in a wide range of operation temperature.

The document 5 (JP-A-8-288376 (1996)) discloses an electrostatic chuck which includes a conductive base of aluminum alloy, an anodized film of aluminum on the surface, and an amorphous aluminum oxide with a thickness of 0.1 to 10 μm formed thereon having excellent plasma-resistance.

The document 6 (JP-A-4-287344 (1992)) discloses an electrostatic chuck which has chucking electrodes inside of ceramics, which is integrated with a conductive base equipped with a cooling function using silicone adhesives.

The insulating film in the electrostatic chuck disclosed in the documents 3 and 5 is formed using sputtering or CVD, the thickness of which is limited to a few micrometers or less, therefore, causing a possibility that the insulation of the insulating film is broken down when voltage is applied to the chucking electrodes.

In the document 5, as shown in FIG. 4, an anodized film 26 of aluminum is formed on the surface of a base 24 of aluminum alloy and an amorphous aluminum oxide layer 22 having excellent plasma-resistance is formed thereon with a thickness of 0.1 to 10 μm. But in such a protective film with a thickness of about 10 μm, pinholes which are created at a film forming step cannot be filled in, thereby eroding the underlayer. In addition, such a film with a thickness of 0.1 to 10 μm is easily eroded under a hard plasma condition, so lacking for practicality. This film also has a problem of flaking off due to an internal stress when forming the film having a thickness of 10 μm or more.

Further, since the base 24 of aluminum alloy is used for the conductive base, the film is cracking at a temperature of 100 degree-C. or higher because of the different coefficients of thermal expansion of the anodized film 26 of aluminum and the amorphous aluminum oxide layer 22 formed thereon.

Furthermore, in case the volume resistivity of the upper amorphous aluminum oxide film 22 is larger than that of the lower anodized film of aluminum, the voltage between the conductive base 24 of the electrostatic chuck 21 and the wafer is weighted toward the amorphous aluminum oxide film 22, resulting in breakdown of the insulation of the amorphous aluminum oxide film 22.

Since the amorphous aluminum oxide film is different in volume resistivity from the anodized film of aluminum, the chucking force cannot rise up immediately and it takes time to become a certain level when voltage is applied. When the applied voltage is turn off, the chucking force cannot be zero immediately and the residual chucking force take places. Thus these response of chucking and release characteristics is degraded and it takes excessive time to attach or detach the wafer, resulting in disadvantage for the process control.

In an electrostatic chuck disclosed in the document 6 (JP-A-4-287344 (1992)), silicone adhesives has a problem that a layer of silicone adhesives is eroded by process gas in an etching equipment.

The insulating film 25 which is formed of a spray coating film of alumina, as disclosed in the patent documents 2 and 4, has a number of voids, which are sealed later using organic silicon or inorganic silicon. But the sealed portion of silicon is easy to be etched by plasma, thereby lowering the withstand voltage. The electrostatic chuck would not working in a short period of time.

SUMMARY OF THE INVENTION

It an object of the present invention to provide an electrostatic chuck which can prevent an insulating film from cracking and breakdown of insulation with an excellent release characteristics of wafer.

An electrostatic chuck according to the present invention includes:

a base serving as a chucking electrode; and an insulating film formed on one principal plane of the base, the top face of the insulating film serving as a placing surface for placing a wafer;

wherein the insulating film is formed of an amorphous ceramics of an oxide and has a thickness in a range of 10 to 100 μm.

It is preferable that the base is formed of metal or both metal and ceramics.

It is preferable that the insulating film contains 1 to 10 atom % of a rare gas element, with a Vickers hardness of 500 to 1,000 HV0.1.

It is preferable that the insulating film is composed of aluminum oxide, yttrium oxide, yttrium-aluminum oxide, or rare earth oxide.

It is preferable that the conductive base contains a metal component of any one of aluminum or aluminum alloy, and a ceramic component of any one of silicon carbide or aluminum nitride, wherein the content of the ceramic component is 50 to 90 mass %.

It is preferable that a protective film of either an anodized film of aluminum or a spray coating film of alumina is formed on the remaining surface of the conductive base excluding the surface on which the insulating film is formed.

According to the above constitution, no cracking occurs in the insulating film and the insulation breakdown can be prevented. Furthermore, the electrostatic chuck with an excellent characteristics of releasing the wafer W can be obtained.

Moreover, formation of a protective film can provide the electrostatic chuck with an excellent durability against plasma.

DETAILED DESCRIPTION OF THE PREFERRED EMBODIMENTS

This application is based on an application No. 2003-147454 filed on May 26, 2003 in Japan, the disclosure of which is incorporated herein by reference.

Hereinafter, preferred embodiments will be described with reference to drawings.

Figure 1:
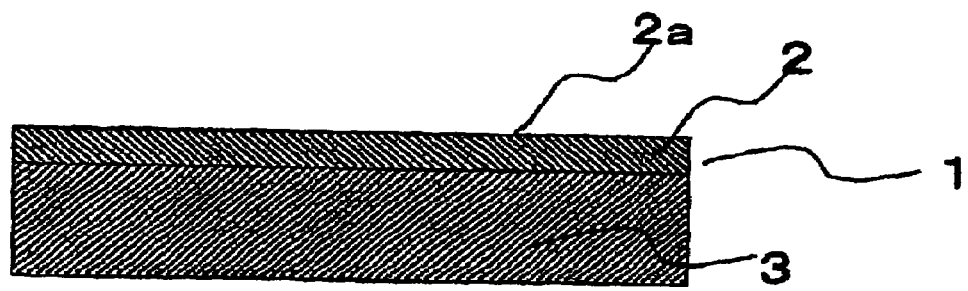
FIG. 1 is a sectional structural view of an example of an electrostatic chuck according to the present invention.
Figure 2:
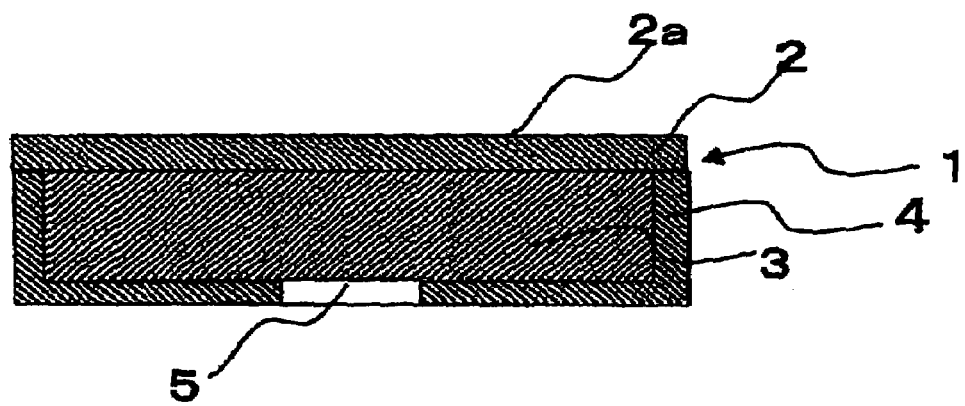
FIG. 2 is a sectional structural view of another example of an electrostatic chuck according to the present invention.
Figure 3:
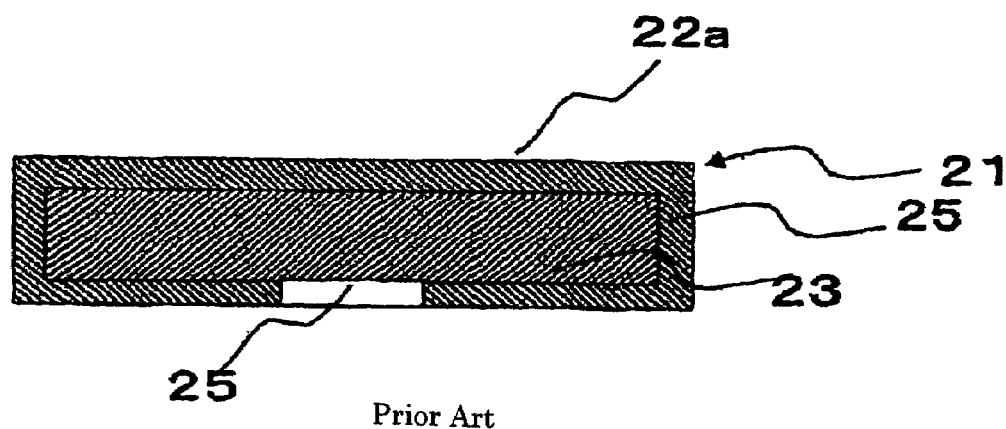
FIG. 3 is a sectional structural view of an example of a conventional electrostatic chuck.
Figure 4:
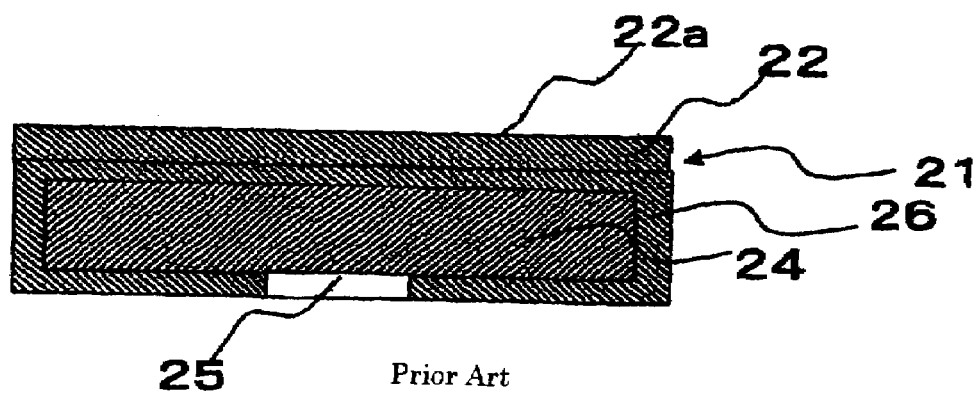
FIG. 4 is a sectional structural view of another example of a conventional electrostatic chuck.
Figure 5:
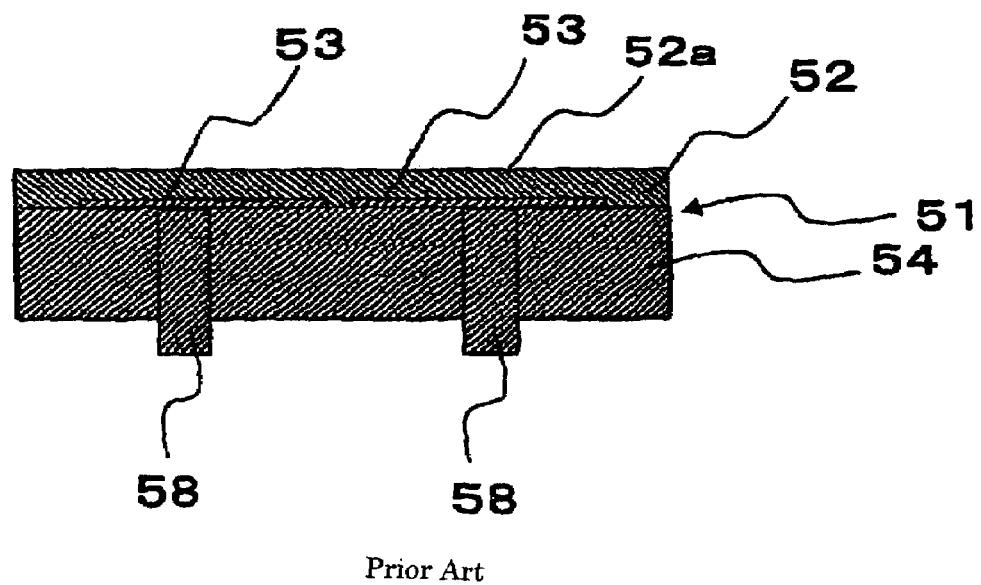
FIG. 5 is a sectional structural view of yet another example of a conventional electrostatic chuck.

FIG. 1 illustrates a schematic structure, showing an example of an electrostatic chuck 1 according to the present invention. An insulating film 2 of amorphous ceramics is formed on the top face of a conductive base 3 of metal or both metal and ceramics. The top face of the insulating film 2 of amorphous ceramics serves as a placing surface 2a for chucking a wafer.

In case the conductive base 3 is composed only of metal, the metal material for the conductive base 3 is preferably selected so as to match the thermal expansion of the insulating film 2 of amorphous ceramics. Since most of metal material has a coefficient of thermal expansion larger than that of amorphous ceramics, the conductive base 3 is preferably composed of a metal material, such as W, Mo, Ti or the like, having a lower coefficient of thermal expansion.

Further, the conductive base 3 is composed of a composite material made of metal and ceramics, it is preferable to use the composite material with a three-dimensional network structure having a frame of a porous ceramic material and pores which is closely filled with aluminum or aluminum alloy. This structure enables both the coefficients of thermal expansion of the insulating film 2 and the conductive base 3 to approach each other.

Furthermore, since the electric resistance of the conductive base 3 becomes about $10^{-7}$ Ω·m, the conductive base 3 is preferably usable for a chucking electrode. In addition, since the conductive base 3 can be composed of material with a larger coefficient of thermal conductivity of about 160 W/(m·K), it is preferable that heat transferred from atmosphere, such as plasma, to the wafer W is easily carried away through the conductive base 3.

When putting the wafer W on the placing surface 2a and applying a chucking voltage of several hundreds volts between the conductive base 3 and the wafer W via a feeding hole 5, electrostatic force is generated between the conductive base 3 and the wafer W to pull the wafer W toward the placing surface 2a. For approaches for feeding electric power to the wafer, one approach is that a conductor stays direct contact with the wafer W. Another approach is that when using in plasma, electric power can be fed to the wafer W through the plasma, so it is not necessary to directly connect a conductor to the wafer W.

The insulating film 2 in the electrostatic chuck 1 according to the present invention, as described above, is formed of a single layer of the insulating film 2 composed of a uniform amorphous ceramics, with a uniform volume resistivity of the insulating film 2 between the conductive base 3 and the placing surface 2a. Therefore, an electric field is uniformly generated inside the insulating film 2 and the electrostatic force rises up quickly to a constant chucking force when the chucking voltage is applied. After the chucking voltage is turned off, the chucking force quickly becomes zero to release the wafer W. Thus the electrostatic chuck 1 with excellent chucking and release characteristics can be obtained.

Alternatively, for the conductive base 3, a ceramic base having a chucking electrode thereon may be used, in which an insulating film 2 may be formed so as to cover this chucking electrode.

Reasons for using such a insulating film 2 of a uniform amorphous ceramics will be explained as follows.

Since crystal lattices in an insulating film composed of a crystalline ceramics are firmly bonded to each other, the lattice constant is hardly changed. In case such a insulating film of the crystalline ceramics is used for the insulating film of the electrostatic chuck, it has little function to relax an internal stress generated in the insulating film from the conductive base 3 and a thermal stress due to difference between coefficients of thermal expansion. However, the insulating film 2 composed of an amorphous ceramics has various lattice constants which can be changed responsively to the stress, unlike the insulating film of the crystalline ceramics, thereby reducing the internal stress much in comparison with the insulating film of the crystalline ceramics. In addition, the insulating film 2 composed of an amorphous ceramics has an aperiodic atomic arrangement, in which spaces in atomic level are easily produced to incorporate an impurity in. Therefore, even if an internal stress is generated due to difference in thermal expansion between the insulating film 2 composed of an amorphous ceramics and the conductive base 3 and a stress during film formation, the stress applied to the insulating film 2 can reduced by slight deformation because the atomic arrangement is irregular and a number of defects in atomic level exist. Furthermore, since the insulating film 2 of an amorphous ceramics has a composition of less oxygen or less nitrogen than the stoichiometric composition of the corresponding crystal having the same composition, defects in atomic level can be easily produced so that the stress between the insulating film 2 and the conductive base 3 can be easily relaxed.

The thickness of the insulating film 2 of an amorphous ceramics is preferably 10 to 100 μm. If the thickness of the insulating film 2 of an amorphous ceramics is below 10 μm, a pinhole or a thin portion is likely to be generated in the insulating film 2 of an amorphous ceramics by the influence of voids or particles on the surface of the conductive base 3. The pinhole or the thin portion would become a defect by exposure to plasma, which can pass through the insulating film 2 to erode the conductive base 3. Consequently, abnormal discharge or particles might be generated due to breakdown of the insulation. Therefore, the insulating film requires at least a thickness of 10 μm or more.

Further, if the thickness of the insulating film 2 is over 100 μm, it would take time of several hours or more to deposit the insulating film 2 of an amorphous ceramics, resulting in poor mass productivity. The internal stress also would become too large, resulting in a problem that the insulating film 2 might flake off the conductive base 3. The thickness of the insulating film 2 is more preferably 30 to 70 μm.

Incidentally, a thickness of 10 μm or more in the present invention means that the minimum thickness of the insulating film 2 on the conductive base 3 is 10 μm or more. A thickness of 100 μm or below means that the maximum thickness of the insulating film 2 on the conductive base 3 is 100 μm or below.

In the insulating film 2 of an amorphous ceramics in the electrostatic chuck 1, argon exists as a rare gas element which has not reacted with other elements. Existence of a number of rare gas elements in the film promotes the insulating film 2 of an amorphous ceramics to be deformed, resulting in a significant effect of relaxing the internal stress. Therefore, even though forming the insulating film 2 of an amorphous ceramics with a thickness of 10 μm or more according to the present invention, such a large stress as to peel off the insulating film 2 can be prevented.

The amount of argon in the insulating film can be controlled by increasing the gas pressure of argon and a minus bias voltage applied to the conductive base 3 during film formation, thereby incorporating more argon ions ionized in plasma into the insulating film 2.

The amount of argon in the insulating film 2 is preferably 1 to 10 atom %, more preferably 3 to 8 atom %. In case the content of the rare gas element is below 1 atom %, the insulating film 2 of an amorphous ceramics cannot be deformed sufficiently with less effect of relaxing the stress, resulting in cracking even at a thickness of about 10 μm. Conversely, it is difficult in manufacture to set the content of the rare gas element at more than 10 atom %.

Although sputtering using another rare gas element instead of argon can attain the same effect, argon gas is preferable because it has a higher sputtering efficiency at a lower cost in view of sputtering efficiency and cost.

For a quantitative analysis of argon in the insulating film 2, after forming an amorphous ceramic film with a thickness of 20 μm on a sintered compact of aluminum oxide as a comparative sample, and then analyzing the sample using the Rutherford backscattering method, and then measuring the total atomic mass and the atomic mass of argon which has been detected, a value in atom percent is calculated by dividing the atomic mass of argon by the total atomic mass.

Further, since the insulating film 2 of an amorphous ceramics contains such a rare gas element as noted above, the hardness thereof becomes smaller than that of a ceramic sintered compact having a similar composition. The more rare gas elements are incorporated in, the smaller the hardness becomes, thereby reducing the internal stress in the film.

Although the insulating film 2 of an amorphous ceramics formed by film formation, such as sputtering, has a concave portion on the surface, there is little void inside the insulating film 2. Therefore, the concave portion on the surface can be removed by polishing the surface, so that the surface area to be exposed in plasma can be minimized anytime. Further, since there is no grain boundary like a polycrystal, etching can be uniformly performed without shedding. Consequently, the insulating film 2 is superior in plasma-resistance to a insulating film of the conventional ceramic polycrystal sintered compact. Moreover, the ceramic polycrystal sintered compact with crystal grain boundaries has a surface roughness of about Ra 0.02, while the surface roughness Ra of the amorphous ceramic insulating film 2 can be lowered to about Ra 0.0003, preferably in view of plasma-resistance.

Furthermore, the Vickers hardness of the insulating film 2 of an amorphous ceramics containing the above rare gas element is preferably 500 to 1,000 HV0.1. If the Vickers hardness is over 1,000 HV0.1, the internal stress becomes larger and the insulating film might flake off. In case the Vickers hardness of the insulating film 2 is below 500 HV0.1, the internal stress of the insulating film becomes smaller and the insulating film hardly flakes off, but the insulating film easily suffers serious scratches because of the small hardness, thereby lowering the withstand-voltage. This is why hard dusts come in between the wafer W and the placing surface 2a of the electrostatic chuck 1 to scratch the insulating film 2 and the dielectric strength of the scratched area may decrease. Accordingly, the Vickers hardness of the insulating film 2 is preferably 500 to 1,000 HV0.1, more preferably 600 to 900 HV0.1.

The insulating film 2 of an amorphous ceramics is preferably composed of aluminum oxide, yttrium oxide, yttrium-aluminum oxide, or rare earth oxide, each of which has an excellent plasma-resistance, and particularly the yttrium oxide is excellent.

Further, the conductive base 3 composed of both metal and ceramics according to the present invention has a coefficient of thermal expansion, which depends on the coefficient of thermal expansion of the porous ceramic body constituting the frame, therefore, the ceramics is preferably silicon carbide or aluminum nitride. The thermal conductivity of the conductive base 3 depends on the thermal conductivity of the metal which is filled in the pores. Therefore, both the coefficient of thermal expansion and the thermal conductivity of the conductive base 3 can be appropriately adjusted by changing the mixture ratio of the two materials. In particular, the above metal is preferably aluminum or aluminum alloy, each of which does not contaminate the wafer W.

In case the content of the ceramic component of the conductive base 3 is below 50 mass %, the strength of the conductive base 3 is greatly lowered, and the coefficient of thermal expansion of the conductive base 3 becomes larger because it depends on the coefficient of thermal expansion of the aluminum alloy rather than the porous ceramic body. Consequently, the difference of thermal expansion between the conductive base 3 and the amorphous ceramic insulating film 2 becomes too large, so that the insulating film 2 may flake off.

Conversely, if the content of the ceramic component of the conductive base 3 is over 90 mass %, the opening porosity of the ceramics becomes smaller and is insufficiently filled with the aluminum alloy, so that the thermal conductivity and the electric conductivity are extremely lowered to spoil the function of the conductive base 3. For the above ceramics, used is porous ceramics, such as silicon nitride, silicon carbide, aluminum nitride, or alumina, which has a lower thermal expansion and a higher rigidity. In order to closely fill the aluminum alloy into the pores, the porous ceramic body with a pore diameter of 10 to 100 µm is preferably used.

Incidentally, for a method for filling the metal into the pores of the porous ceramic body, after inserting the porous ceramic body into a press machine, and then heating up the machine, and then injecting the molten metal, pressing is performed by pressure.

When setting the mass ratio of SiC in 50 to 90%, the coefficient of thermal expansion of the conductive base 3 can be varied in $11 \times 10^{-6}$ to $5 \times 10^{-6}$/degree-C. so as to coincide with the coefficient of thermal expansion or the deposition stress of the insulating film 2.

Further, when the electrostatic chuck 1 according to the present invention is used in an etching process, a corrosive gas may invade a exposed surface in the side face and the bottom face of the electrostatic chuck 1 which is protected with a cover ring (not shown). Therefore, a protective film 4 is preferably provided so as to improve the corrosion resistance to plasma.

On the side face and the bottom face of conductive base 3, which are less corroded than the wafer placing surface 2a, a spray coating of alumina or an anodized film of aluminum is preferably formed for the protective film 4. The thickness of the above spray coating of alumina is preferably 50 to 500 µm. The thickness of the above anodized film of aluminum is preferably 20 to 200 µm.

In a case the spray coating of alumina is formed for the protective film 4, surface material of the conductive base 3 is arbitrary. In another case the anodized film of aluminum is formed for the protective film 4, the surface material of the conductive base 3 needs to be aluminum alloy. When the conductive base 3 having the above porous ceramic body impregnated with aluminum alloy is provided with an anodized film, the anodized film grows only on the aluminum area of the surface and the ceramic area is partly exposed, thereby degrading the plasma-resistance and the insulation between the plasma atmosphere and the conductive base 3. Therefore, when impregnating with aluminum alloy, the aluminum alloy is preferably provided on the surface of the conductive base 3. Formation of the anodized film of aluminum can improve the plasma-resistance, and the surface insulation can obtained by oxidizing the aluminum on the surface.

Incidentally, the feeding hole 5 is preferably provided on a part of the bottom face of the plasma protective film 4 so as to ensure an electric conduction with the conductive base 3.

Next, a method for manufacturing the electrostatic chuck 1 according to the present invention will be described. Herein described is the electrostatic chuck 1 which includes the conductive base 3, the protective film 4 and the insulating film 2, wherein the conductive base 3 contains a porous body of silicon carbide impregnated with aluminum alloy and a surface layer of aluminum alloy, and the plasma-proof protective film 4 is the anodized film formed on the conductive base 3, and the amorphous ceramic insulating film 2 is formed of aluminum oxide by sputtering.

After adding a powder of silicon oxide ($SiO_2$), a binder and a solvent to a powder of silicon-carbide with an average particle diameter of about 60 µm, and then kneading them, granules are produced using a spray dryer. Next, after forming the granules into a disk-shaped body using a rubber press molding method, and then baking it in vacuum atmosphere at a temperature of about 1,000 degree-C., which is lower than a regular baking temperature, a porous ceramic body of silicon nitride having a porosity of 20% is produced and then processed into a desired shape.

Next, after loading this porous ceramic body into a die of a press machine, and then heating up the die up to 680 degree-C., and then filling the die with a molten aluminum alloy with a purity of 99% or over, they are pressurized up to 98 MPa by dropping a punch. Next, after cooling it in the pressurized state, the porous ceramic body having aluminum alloy as metal filled in the pores is formed. When using the die with a size larger than the size of the porous ceramic body, an aluminum alloy layer is formed on the whole surface of the conductive base 3, resulting in the conductive base 3 with a predetermined shape.

Next, the surface of the aluminum alloy layer on the surface of the above conductive base 3 is processed by anodic oxidation coating, obtaining the anodized film of aluminum. The anodic oxidation coating includes dipping an anode of the conductive base 3 and a cathode of carbon or the like in acid, such as oxalic acid or sulfuric acid, and then electrolyzing, so that a coating of $\gamma$-$Al_2O_3$ is formed on the surface of the aluminum alloy. Since this coating is porous, either dipping the coating in boiling water or reacting it with heated steam makes the protective film 4 of a dense coating of boehmite (AlOOH).

In order to form the insulating film on the conductive base 3 with the above protective film 4, after removing by cutting the protective film 4 located on a surface on which the insulating film 2 is to be formed, and then mirror finishing the surface of the conductive base 3, a deposit surface is completed.

Moreover, in case the spray coating of alumina is formed on the conductive base 3 for the protective film 4, alumina is sprayed after roughening the surface of the conductive base 3 using blast finishing or the like, thereby enhancing the adhesiveness. Further, a metal film of nickel system is preferably sprayed for surface preparation before aluminaspraying, thereby enhancing the adhesiveness with the protective film 4. The thermal spray coating of alumina is formed by melting and bombarding power from 40 μm to 50 μm in diameter of alumina in atmospheric pressure plasma or reduced pressure plasma. The reduced pressure plasma is preferable in view of higher gastightness.

Since opening pores exist in the spray coating as is, the protective film 4 is processed using sealing by impregnating an organic silicon compound or an inorganic silicon compound and heating.

The insulating film 2 of an amorphous ceramics is formed by sputtering on the above finished surface of the conductive base 3. In a sputtering equipment of parallel plate type, a target having such a composition as the insulating film 2 is set. Herein an aluminum oxide sintered compact is used for the target, and the conductive base 3 is set in a copper holder as opposite to the target. The bottom face of the conductive base 3 and the top face of the holder are bonded to each other by applying a liquid alloy of In and Ga, thereby enhancing the thermal transfer between the conductive base 3 and the holder and improving the cooling efficiency of the conductive base 3, resulting in the insulating film 2 of an amorphous ceramics with high quality.

Thus the conductive base 3 is set in a chamber of the sputtering equipment, and after setting a degree of vacuum to 0.001 Pa, an argon gas flows at 25 to 75 sccm.

Next, when applying a RF voltage between the target and the holder, plasma is generated. Next, the target and the conductive base 3 are cleaned up by pre-sputtering the target and etching the conductive base 3 for several minutes.

The insulating film of an amorphous ceramics composed of aluminum oxide is deposited by sputtering with the RF power of 3 to 9 W/cm$^2$. The conductive base 3 is biased at about −100 to −200 V to attract a molecule ionized from the target and an argon ion. In case the conductive base 3 is insulated, the surface of the conductive base 3 is electrically charged by the argon ion, with a state that the subsequent argon ion hardly penetrates. After the argon ion penetrates in the film, the argon ion discharges an electric charge to restore to the argon atom and to remain in the film. In order to entrap more argon into the film, it is necessary to let the electric charge out from the feeding hole of the conductive base 3 via the In-Ga layer to the holder, to keep a constant state that the argon can be easily entrapped into the insulating film 2 of an amorphous ceramics.

In addition, in case the conductive base 3 is cooled weakly, a part of the amorphous ceramic insulating film 2 is crystallized from amorphous state, thereby decreasing the dielectric strength in part and the plasma-resistance. In cooling the conductive base 3, supplying a cooling plate with a cooling water enables the inside of the base 3 holder to be sufficiently cooled, preferably keeping the conductive base 3 at a temperature of several dozens degree-C.

The insulating film 2 of an amorphous ceramics with a thickness of about 50 μm is produced at a deposit rate of 3 μm/hour for 17 hours.

Then, the surface of the amorphous ceramic insulating film 2 is finished by polishing to form the wafer placing surface, completing the electrostatic chuck 1.

EXAMPLE 1

A porous body of SiC with a diameter of 198 mm and a thickness of 5 mm was impregnated with aluminum alloy to form a layer of aluminum alloy with a thickness of 1 mm on the side face and the top and bottom faces, obtaining the conductive base 3 with a diameter of 200 mm and a thickness of 7 mm, which contained 80 mass % of SiC and 20 mass % of aluminum alloy. Next, an insulating film of a ceramics was formed on the top surface to make samples of No. 1 to 11, which were evaluated on items of insulation breakdown, cracking, flaking, plasma-resistance of the insulating film.

The insulation breakdown of the insulating film was evaluated in whether the insulation was broken down or not when a voltage of 3 kV was applied between the wafer and the conductive base 3.

Further, regarding the evaluation on the plasma-resistance of the insulating film, the placing surface was exposed for 100 hours in plasma which was generated between the placing surface and an opposite electrode, which was located above the placing surface, by supplying a radio frequency power of 2 kW between the opposite electrode and the conductive base 3 with a halogen gas of $Cl_2$ flowing at 60 sccm and a vacuum degree of 4 Pa, in a state that the side face of the electrostatic chuck was provided with a cover ring to cover the side face and no wafer was placed on the wafer placing surface. Then, after observing conditions of the insulating film, a condition that the conductive base was not exposed even though the insulating film was corroded and that the insulating film showed good properties of no irregularities on the surface was defined as "O", and another condition was defined as "X".

Moreover, for comparative examples used were the sample No. 10 which had a spray coating film of alumina on the whole surface of the conductive base 3 with the same shape, and the sample No. 11 which included an anodized film formed on an aluminum alloy and an amorphous aluminum oxide film with a thickness of 10 μm formed thereon.

The result is shown in Table 1.

TABLE 1

| sample No. | form of insulating film | material of insulating film | thickness (μm) | insulation breakdown of insulating film | cracking, flaking | plasma-resistance | chucking force (N/m$^2$) | residual chucking force |
|---|---|---|---|---|---|---|---|---|
| *1 | amorphous film | aluminum oxide | 3 | yes | no | X | — | — |
| *2 | amorphous film | aluminum oxide | 8 | yes | no | X | — | — |
| 3 | amorphous film | aluminum oxide | 10 | no | no | O | 250,000 | 0 |
| 4 | amorphous film | aluminum oxide | 50 | no | no | O | 10,000 | 0 |
| 5 | amorphous film | aluminum oxide | 100 | no | no | O | 2,500 | 0 |

TABLE 1-continued

| sample No. | form of insulating film | material of insulating film | thickness (μm) | cracking, flaking | insulation breakdown of insulating film | plasma-resistance | chucking force (N/m²) | residual chucking force |
|---|---|---|---|---|---|---|---|---|
| *6 | amorphous film | aluminum oxide | 150 | no | yes | — | — | — |
| 7 | amorphous film | yttrium oxide | 50 | no | no | ○ | 10,000 | 0 |
| 8 | amorphous film | yttrium-aluminum oxide | 50 | no | no | ○ | 10,000 | 0 |
| 9 | amorphous film | cerium oxide | 50 | no | no | ○ | 12,000 | 0 |
| *10 | spray coating film | aluminum oxide | 100 | no | no | X | — | — |
| *11 | anodized film + amorphous film | aluminum oxide | 100 + 10 | no | no | ○ | 3,500 | 600 |

Note:
Samples marked with "*" are outside the scope of the invention.

It can be seen that the samples No. 3 to 5, 7 to 9, which had the amorphous ceramic insulating film 2 with a thickness of 10 to 100 μm according to the present invention, showed excellent properties that no insulation breakdown, no cracking and no flaking occurred in the insulating film with good plasma-resistance.

On the other hand, the samples No. 1 and 2, which had the amorphous ceramic insulating film 2 with a smaller thickness, showed no cracking and no flaking, but could not be used in a short time because the conductive base was exposed by corrosion due to plasma. The sample No. 6, which had the amorphous ceramic insulating film 2 with a larger thickness of 150 μm, showed that cracking and flaking occurred in a short time. The comparative examples of both the sample No. 10 with the spray coating film of alumina and the sample No. 11 with the anodized film of aluminum showed that no cracking and no flaking occurred, but a part of the film was ragged by plasma to expose the conductive base and the insulation was degraded between the wafer and the conductive base, with no function of the electrostatic chuck.

Meanwhile, the samples having the insulating film 2 with a thickness in a range of 10 to 100 μm according to the present invention showed excellent properties that no cracking and no flaking occurred in the insulating film 2 and no irregularities was formed on the surface even in plasma.

In addition, the samples No. 3, 4, 5, 7, 8 and 9, which showed that no insulation breakdown and no flaking occurred in the film with good plasma-resistance, were evaluated on chucking force and release characteristics. For a comparative example used were the sample No. 11 which included an anodized film formed on an aluminum alloy and an amorphous aluminum oxide film formed thereon.

The electrostatic chucking force was measured in vacuum at room temperature, where placing a 1-inch square Si wafer on the placing surface, and then applying a voltage of 500 V between the wafer W and the conductive base 3, and then pulling up the Si wafer 1 minute later, a force required for pulling up was measured by a load cell and the measured value divided by the area of the placing surface was defined as the electrostatic chucking force per unit area. The residual chucking force was measured in vacuum, where placing a 1-inch square Si wafer on the placing surface, and then applying a voltage of 500 V for 2 minutes and turning off the voltage, and then pulling up the Si wafer 3 seconds later, a force required for pulling up was measured by the load cell and the measured value divided by the 1-inch square area of the placing surface was defined as the residual chucking force per unit area.

The samples No. 3 to 5, 7 to 9, which had the amorphous ceramic insulating film 2 with a thickness of 10 to 100 μm according to the present invention, showed excellent chucking characteristics that the electrostatic chucking force was as large as 1,000 N/m² or more and the residual chucking force was 0 N/m².

The sample No. 11, which had an insulating film of amorphous alumina on an anodized film of aluminum, showed that the electrostatic chucking force was favorably as large as 3,500 N/m² but the residual chucking force was as large as 600 N/m², resulting in no usability. The reason why this residual chucking force was large is imagined to be a cause that the volume resistivity of the anodized film was different from that of the amorphous aluminum oxide film.

EXAMPLE 2

Secondly, using the conductive base 3 with a diameter of 200 mm and a thickness of 7 mm as used in Example 1, and an insulating film 2 of amorphous aluminum oxide, various films were deposited while changing the amount of argon contained in the amorphous ceramic insulating film 2 under various deposit conditions. Whether flaking and cracking occurred or not was evaluated.

TABLE 2

| sample No. | amount of argon (atom %) | cracking, flaking | insulation breakdown of insulating film |
|---|---|---|---|
| 21 | 0.5 | yes | — |
| 22 | 1 | no | no |
| 23 | 3 | no | no |
| 24 | 6 | no | no |
| 25 | 10 | no | no |

The sample No. 21, which had the smaller amount of argon of 0.5 atom %, showed cracking occurred in the insulating film.

However, the samples No. 22 to 25, which had the amount of argon of 1 to 10 atom % according to the present invention, showed no cracking and no insulation breakdown occurred in the insulating film. Therefore, it can be seen that the amount of argon is preferably 1 to 10 atom %.

Next, using the conductive base 3 with a diameter of 200 mm and a thickness of 7 mm as used in Example 1, and an insulating film 2 of amorphous aluminum oxide, various films were deposited while changing Vickers hardness of the insulating film 2 under various deposit conditions. Whether flaking and cracking occurred or not was evaluated.

The insulating film 2 composed of amorphous ceramics of aluminum oxide with a thickness of 30 μm, which was formed on the conductive base 3 under various deposit conditions, was evaluated.

Incidentally, the Vickers hardness, according to hardness unit, HV0.1, of JIS (Japanese Industrial Standards) R1610, was measured base on a dimension of the indentation which was formed by pressing a load of 0.98 N for 15 seconds.

TABLE 3

| sample No. | hardness (HV) | cracking, flaking | insulation breakdown of insulating film |
|---|---|---|---|
| 31 | 400 | no | yes |
| 32 | 500 | no | no |
| 33 | 750 | no | no |
| 34 | 1,000 | no | no |
| 35 | 1,200 | yes | — |

The sample No. 31, which had a small Vickers hardness of 400 HV0.1, showed that no cracking occurred but the insulation was broken down. This is imagined why the film was scratched because of the small hardness, so the insulation breakdown occurred. Further, the sample No. 35, which had a larger Vickers hardness of 1,200 HV0.1, showed that cracking occurred in the insulating film. This is imagined why the film could not relax the internal stress, so cracking occurred.

Accordingly, it can be seen that the Vickers hardness is preferably 500 to 1,000 HV0.1, as the samples No. 32 to 34.

EXAMPLE 3

Samples No. 41 to 44, in which material of the insulating film of amorphous ceramics was aluminum oxide, yttrium oxide, yttrium-aluminum oxide, or cerium oxide, respectively, and a comparative sample No. 45, in which the insulating film was formed of polycrystal alumina, were exposed in plasma, then each etching rate of the insulating film was compared.

In the evaluation way, in a state that the outer circumferential top face and the side face of the electrostatic chuck were provided with a cover ring to cover areas having no insulating film, the surface of the insulating film was exposed in plasma. Regarding the plasma condition, the insulating film was exposed for 2 hours in plasma which was generated between the placing surface and an opposite electrode, which was located above the placing surface, by supplying a radio frequency power of 2 kW between the opposite electrode and the conductive base with a halogen gas of $Cl_2$ flowing at 60 sccm and a vacuum degree of 4 Pa. Then, the etching rate was calculated based on an amount of the decrease of thickness due to etching of the insulating film. The amount of the decrease of thickness of each film divided by the amount of the decrease of thickness of the sintered alumina was defined as the etching rate. The result is shown in Table 4.

TABLE 4

| sample No. | material | etching rate |
|---|---|---|
| 41 | aluminum oxide | 0.7 |
| 42 | yttrium oxide | 0.2 |
| 43 | yttrium-aluminum oxide | 0.3 |
| 44 | cerium oxide | 0.3 |
| 45 | sintered compact of aluminum oxide | 1 |

The sample No. 41, having an aluminum oxide film, had a smaller etching rate of 0.7, as compared to the sample No. 45 of polycrystal alumina. Each etching rate of the insulating film 2 of amorphous ceramics, which was yttrium oxide, yttrium-aluminum oxide, or cerium oxide, was as small as 0.2, 0.3, or 0.3, respectively. It can be seen that they had an extremely excellent plasma-resistance.

EXAMPLE 4

The content of SiC with a diameter of 198 mm and a thickness of 5 mm was changed to 50 to 90 mass % (the remaining part was aluminum alloy). On the top face of the conductive base 3 with a diameter of 200 mm and a thickness of 7 mm, which was provided with a layer of aluminum alloy with a thickness of 1 mm on the side face and the top and bottom faces, deposited was an aluminum oxide film of amorphous ceramics. This was subject to a heat cycle test with a range of −20 degree-C. to 200 degree-C., but no cracking occurred in the amorphous aluminum oxide film.

EXAMPLE 5

A porous body of SiC, containing 80 mass % of SiC and 20 mass % of aluminum alloy, with a diameter of 198 mm and a thickness of 5 mm was impregnated with aluminum alloy to form a layer of aluminum alloy with a thickness of 1 mm on the side face and the top and bottom faces, obtaining the conductive base 3 with a diameter of 200 mm and a thickness of 7 mm. On the top face of the conductive base 3, formed was an amorphous aluminum oxide. On the remaining face formed was either an anodized film of aluminum or a spray coating film of alumina for a plasma-proof protective film. Each of electrostatic chuck 1 obtained in this way was subject to a heat cycle test with a range of −20 degree-C. to 200 degree-C., but no cracking occurred in the protective film.

Although the present invention has been fully described in connection with the preferred embodiments thereof and the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. An electrostatic chuck comprising:
a base serving as a chucking electrode; and
an insulating film formed on one principal plane of the base, the top face of the insulating film serving as a placing surface for a wafer;
wherein the insulating film is formed of an amorphous ceramics of an oxide and has a thickness in a range of 10 to 100 μm and, wherein the conductive base contains a metal component of any one of aluminum or aluminum alloy, and a ceramic component of any one of silicon carbide or aluminum nitride, wherein the content of the ceramic component is 50 to 90 mass %.

2. An electrostatic chuck comprising:

a base serving as a chucking electrode; and an insulating film formed on one principal plane of the base, the top face of the insulating film serving as a placing surface for a wafer;

wherein the insulating film is formed of an amorphous ceramics of an oxide and has a thickness in a range of 30 to 70 μm, and wherein the base contains a metal component of any one of aluminum or aluminum alloy, and a ceramic component of any one of silicon carbide or aluminum nitride, wherein the content of the ceramic component is 50 to 90 mass %.

* * * * *